United States Patent [19]
Arai et al.

[11] Patent Number: 5,247,523
[45] Date of Patent: Sep. 21, 1993

[54] CODE ERROR CORRECTION APPARATUS

[75] Inventors: Hideo Arai, Chigasaki; Keizo Nishimura, Yokosuka; Yasuyuki Inoue, Katsuta, all of Japan

[73] Assignee: Hitachi, Ltd., Tokyo, Japan

[21] Appl. No.: 551,009

[22] Filed: Jul. 11, 1990

[30] Foreign Application Priority Data

Jul. 12, 1989 [JP] Japan ................. 1-177926
Apr. 20, 1990 [JP] Japan ................. 2-102944

[51] Int. Cl.⁵ .............................. G06F 11/10
[52] U.S. Cl. ........................... 371/37.4; 371/32; 371/68.1; 371/69.1
[58] Field of Search .......... 371/35, 32, 33, 34, 371/37.4, 68.1, 68.2, 69.1

[56] References Cited

U.S. PATENT DOCUMENTS

| | | | |
|---|---|---|---|
| 3,646,518 | 2/1972 | Weinstein | 371/35 |
| 4,471,485 | 9/1984 | Prevot et al. | 371/35 |
| 4,675,870 | 6/1987 | Baggen | 371/37.1 |
| 4,939,731 | 7/1990 | Reed et al. | 371/32 |
| 4,943,964 | 7/1990 | Hatanaka et al. | 371/31 |
| 4,956,641 | 9/1990 | Matai et al. | 371/69.1 X |
| 5,010,553 | 4/1991 | Scheller et al. | 371/35 |
| 5,027,356 | 6/1991 | Nakamura et al. | 371/32 |

FOREIGN PATENT DOCUMENTS 57-10561 1/1982 Japan .
63-211923 9/1988 Japan .
63-317990 12/1988 Japan .

Primary Examiner—Robert W. Beausoliel, Jr.
Assistant Examiner—Ly V. Hua
Attorney, Agent, or Firm—Antonelli, Terry, Stout & Kraus

[57] ABSTRACT

A product code block generated by adding an outer code block and an inner code block to digital information signal arranged in matrix is received at least twice by a code error correction apparatus. In decoding the first received product code block by use of an inner code parity, an error flag is set for an inner code block having an uncorrectable error by an inner code parity. In decoding the second received product code block by use of an inner code parity, the error flag is referenced so that an inner code block that could be correctly decoded or corrected in the second decoding of all the inner code blocks having an uncorrectable error in the first decoding is replaced by the second inner code block. Also, the check information such as a check sum is generated and stored each time of receiving, and an error flag is set for even an inner code block that could be corrected in either the first or second decoding, if the check sums for them fail to coincide with each other.

14 Claims, 15 Drawing Sheets

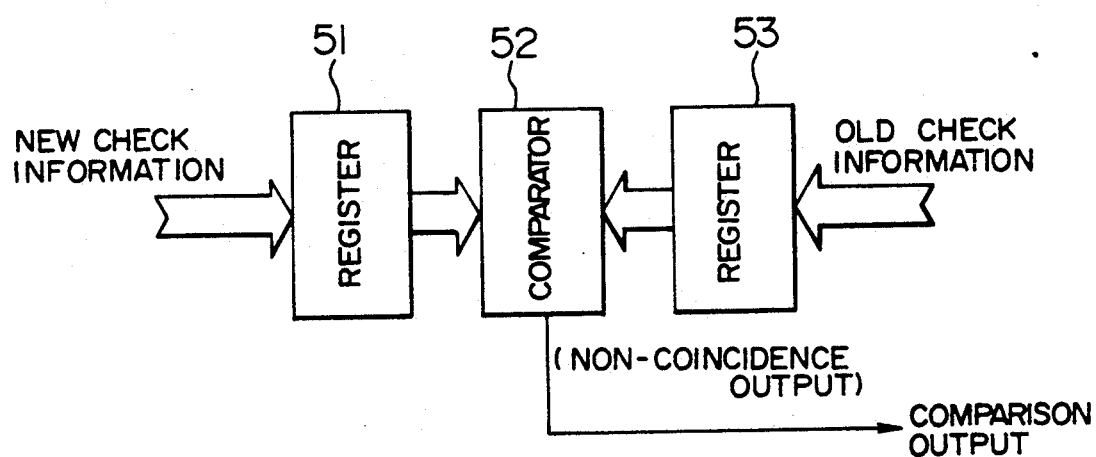
F I G. 15

F I G. 16
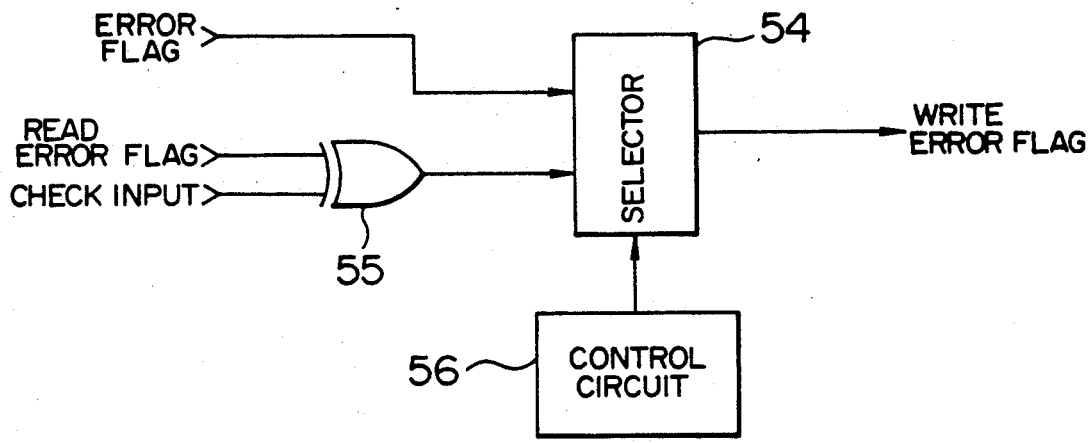
F I G. 17
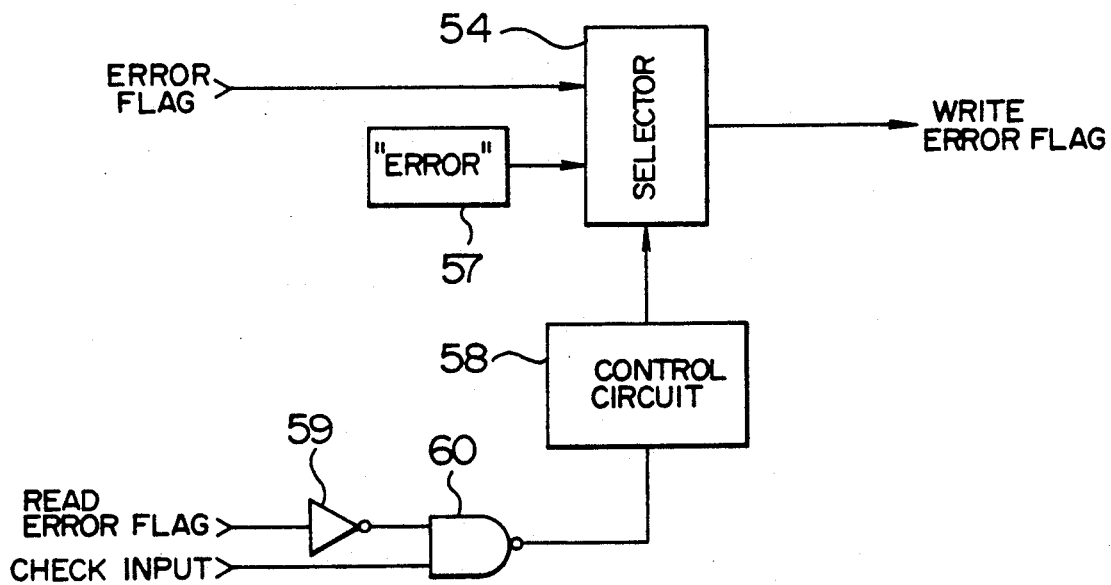

CODE ERROR CORRECTION APPARATUS

BACKGROUND OF THE INVENTION

The present invention relates to an error correction apparatus, or more in particular to a code error correction apparatus highly capable of error correction even in case of generation of many code errors of a digital information signal.

A conventional code error correction apparatus, as described in JP-A-57-10561, encodes a transmission data in duplex way to form a product code block including an inner code block and an outer code block. After the inner code block is decoded, a pointer is added to each word in each block for which an error is incapable of being corrected. At the time of decoding the product code block using the outer code block, the status of the particular pointer is checked thereby to improve the error correction ability while at the same time preventing error detection failure or erroneous correction. In a method for further improving the error correction ability of this code error correction apparatus, as disclosed in JP-A-63-211923, the same signal block is transmitted a plurality of times, and a data determined as an error in the first received signal is replaced by a second or subsequent corresponding data in order to reduce data errors.

The technique disclosed in JP-A-63-211923 is effective as long as the amount of error is comparatively small and at least one of a plurality of times of data transmission is correct. Nevertheless, a system to which this conventional technique is required to be applied has an extremely great number of data errors in most cases. In such a system, all the blocks may contain an uncorrectable error, or even when an error is determined correctable, may have so many a data error as to defy a decision. Even against such a transmission signal, it is necessary to form a product code block by combining signals as apparently correct as possible for decoding an outer code. In an audio data for digital VTR having a D2 format, for example, the first block data is recorded in an area near to the trailing end of magnetic tape and the second block data in an area near to the leading end of the next track. Taking the tracking stability of a reproducing head into consideration, the data at the trailing end of track, that is, the first data is more apparently correct. In the aforementioned conventional system, however, if the first data is determined erroneous, the second data is undesirably employed even if erroneous. As a result, the more apparently correct data is thus erased, thereby posing the problem that a signal which otherwise could have been corrected with an outer code with the first data becomes uncorrectable.

Another method in which the error correction ability is further improved is disclosed in JP-A-63-317990. According to this method, a product code block recorded in a medium is reproduced a plurality of times or a product code is transmitted a plurality of times, so that a data given by a code error correction apparatus is decoded by an inner code (first check word) and then by an outer code (second check word). While the data is being decoded by an outer code, a data with as small errors as possible is selected out of those data reproduced a plurality of times and corrected by error detection with an inner code thereby to improve the correction ability. In this method, even when an error could not be detected by an inner code, a plurality of reproduced data are compared with each other to detect an error for an improved data reliability.

The technique disclosed in JP-A-63-317990 is such that after the product code blocks reproduced a plurality of times are stored in memory respectively, the data and error flag are read out of each memory at the same time. These data are compared with each other, while selecting a data as free of an error uncorrectable by inner code as possible and decoding it by outer code. Further, the data are compared to check for error detection failure. This method, however, fails to take into consideration the required memory capacity. If the block made up of product codes is large in size or the same block is subjected to recording and reproduction a number of times, therefore, a number of memories of large capacity are required.

SUMMARY OF THE INVENTION

Accordingly, a first object of the present invention is to provide a configuration of an error correction code and a decoding apparatus thereof which is highly capable of error correction without great quality deterioration of a reproduction signal even when there are many code errors.

A second object of the present invention is to provide a code error correction apparatus capable of improving the error correction ability and preventing an error detection failure in a multiplex recording and reproduction without increasing the memory capacity.

According to one aspect of the present invention, there is provided a code error correction apparatus in which even if all data blocks transmitted a plurality of times contain an uncorrectable error, a more apparently correct data is selected to configure a product code block, thereby improving the correction ability with an outer code. Also, even when two or more blocks containing a correctable error are transmitted, the most apparently correct block data is employed to make possible correction by outer code as far as possible.

The first object of the present invention is achieved by an apparatus in which not only the first but also the second and subsequent ones of a plurality of received signals are checked for error in order to employ a data having a minimum error.

In order to achieve the second object of the present invention, there is preferably provided a code error correction apparatus in which in respect of a product code block transmitted or reproduced a plurality of times repetitively, there is provided a memory for storing a data for a product code block and check information of at least one word for each inner code block. From the data and parities contained in each code block decoded by inner code, the check information is formed as determinable arithmetically, that is, what is called a check sum of least significant bytes of the total sum of data and parities, for instance.

With regard to the first product code block transmitted or reproduced, the check information formed by the inner code block, together with the data after decoding of each inner code, is written at a predetermined address in a memory. In respect of the second or subsequent same product code block transmitted or reproduced, on the other hand, only the inner code block for which no error is detected by decoding of an inner code or which is corrected, is written at the same address as a corresponding memory address of the first inner code block, while the check information thereof is written at a predetermined memory address different from the first inner code block and corresponding to the number of times of transmission or reproduction. After completion of a predetermined number of times of transmission or reproduction and the decoding of the inner code, a plurality of check information attached to each inner code block and written in memory for each number of times of transmission or reproduction are read out and compared. If these check information fail to coincide with each other, an error flag indicating an error in the particular inner code block is produced, thereby permitting reference at the time of decoding of the outer code. This is in order to remove an inner code block designated as having no error by erroneous correction.

In this way, the check information is compared only for those blocks having no uncorrectable errors, and for this purpose, an error flag indicating the result of inner code decoding provides an appropriate reference.

Now, explanation will be made about the decoding of an inner code for a plurality of product code blocks having the same contents. In decoding corresponding inner code blocks having the same contents, a block for which a first error is not detected or which is corrected has the first check information thereof written in the check information write address of all corresponding inner code blocks on the memory. In other words, with respect to an inner code block for which an error is not detected or which is corrected by the first decoding the first check information is written at a number n of predetermined points on the memory int he case of n times of transmission or reproduction of the product code block. In the case where no error of the particular inner code block is detected or the particular inner code block is corrected at the time of the second or subsequent decoding, the check information is overwritten at a predetermined single point on the memory. As a result, with regard to the inner code block for which an uncorrectable error has been detected, no error occurs at the time of comparison of check information even if the check information is not written in memory.

Also if the memory address of the check information for each inner code block of the product code block is shared by a plurality of transmissions or reproductions, the required memory capacity is further reduced. In such a case, when writing in memory an inner code block for which no error has been detected or which has been corrected at the time of second or subsequent decoding, the check information generated in an inner code block thus far written in memory is read out of the memory and compared with the new check information. This new check information is written at the same address, and if the new and old check information fail to coincide with each other, the error flag of the particular inner code block is changed. The error flag is changed in such a manner that since all the second and subsequent inner code blocks have no error detected or an error corrected, the error flag is reversed (that is, set) to indicate an uncorrectable error, in the case where the old and new check information fail to coincide with each other in spite of the fact that the old inner code block previously decoded and stored in memory has no error detected or an error corrected. Also, although the old and new check information naturally fail to coincide with each other in the case where the old inner code block has an uncorrectable error, the error flag is reversed (that is, reset) when the second or subsequent new inner code block written in memory anew has no error detected or an error corrected.

Alternatively, an error flag may be replaced by the one indicating the presence of an uncorrectable error if the old and new check information fail to coincide with each other only in the case where the error flag attached to the old inner code block indicates an error detection failure or correction (this status is generally expressed as "absence of error flag"), and an error flag of the new inner code block indicating the second or subsequent error detection failure or correction may be used in the other cases.

As a result of the above-mentioned configuration and operation, the inner code-decoded data transmitted or recorded/reproduced a plurality of times repetitively which have no error detected or have an error corrected are overwritten in a memory provided for a single product code block. Even an inner code block for which an uncorrectable error has been detected at the time of the first transmission or reproduction, therefore, is rewritten into a correct inner code block in the case where no error is detected or correction is made at the time of second or subsequent transmission or reproduction. For this reason, if an outer code block is read out from this memory after application of the inner code block by repetitive transmission or reproduction of the product code block, substantially the same effect is produced as if the inner code block is stored in separate memory for each transmission or reproduction and a data as free of error as possible is selected from the block at the time of decoding of the outer code, thus improving the error correction ability. Further, if a check sum data or the like is compared, for example, between he inner code blocks having no error detected by inner code, error correction or error detection failure at the time of decoding of inner code is detectable for an improved data reliability. JP-A-63-317990 refers to the case in which outer code data are compared one by one to recheck for an error. In view of the characteristic of the error correction code, however, numerous data may be contained in an inner code block by a burst error in the case where a detection or correction error is caused by inner code. Therefore, substantially the same effect is attained by the method according to the present invention.

According to the present invention, a similar effect is obviously obtained in the case of a single type of encoding instead of product code configuration (such as when only an inner code is attached as mentioned herein) if the same code block is repetitively transmitted or recorded/reproduced.

BRIEF DESCRIPTION OF THE DRAWINGS

FIGS. 13 and 15, are block diagrams showing an example of configuration of check circuits 39 and 49.

FIGS. 16 and 17 are block diagrams showing an example of configuration of a flag processing circuit 48 according to the embodiment of FIG. 14.

DESCRIPTION OF THE PREFERRED EMBODIMENTS

An embodiment of the present invention will be described below with reference to the accompanying drawings.

Figure 2:
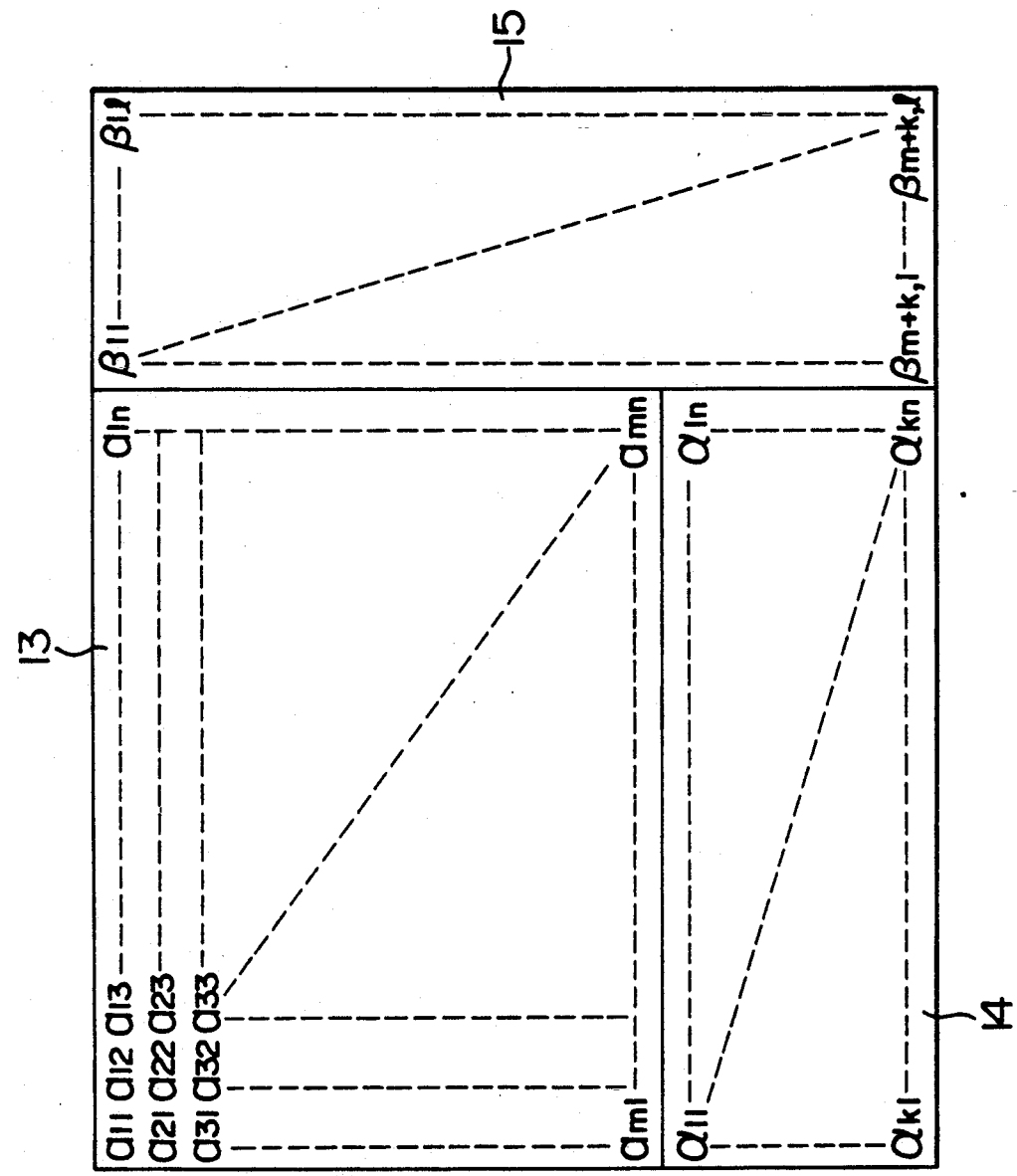
FIG. 2 is a schematic diagram showing a product code block providing an inner signal to an error correction apparatus according to the present invention.

FIG. 2 is a schematic diagram showing a product code block representing an input signal to an error correction circuit according to the present invention. In FIG. 2, reference numeral 13 designates a signal group, numeral 14 an outer code group, and numeral 15 an inner code group. In the group 13 of signals arranged in matrix, signal elements $a_{11}, a_{21}, \ldots, a_{ml}$ along the direction of columns have attached thereto outer codes $\alpha_{11}, \alpha_{21}, \ldots, \alpha_{kl}$ by Read-Solomon method or the like technique. Outer codes are affixed also to the signal elements on the second and subsequent rows by similar technique. The signals elements $a_{11}, a_{12}, \ldots, a_{ln}$ arranged in horizontal direction in the drawing of the signal group 13 have also affixed thereto inner codes $\beta_{11}, \ldots \beta_{11}$ by such a technique as Read-Solomon method. Inner codes are also affixed to the signal elements on the second and subsequent rows and the outer codes 14. The signal group 13, the outer codes 14 and the inner codes 15 constitute a product code block.

Figure 3:
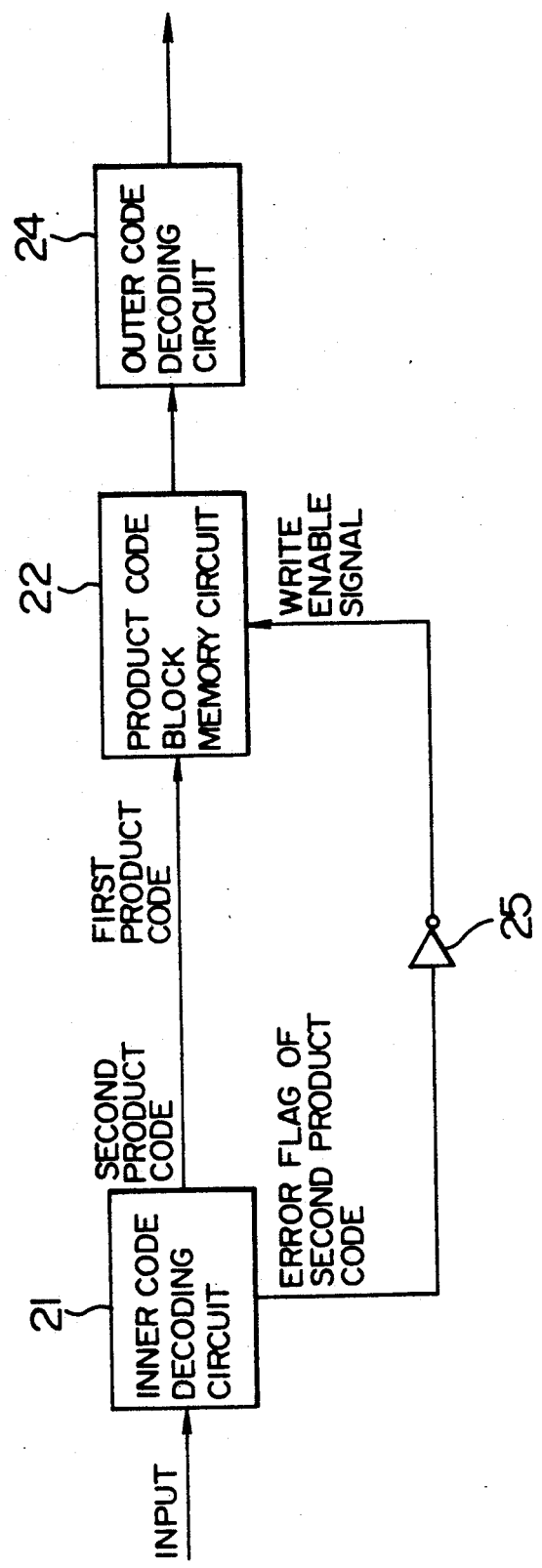
FIGS. 3 to 10 are block diagrams showing an error correction apparatus according to first to eighth embodiments of the present invention respectively.

FIG. 3 is a block diagram showing an error correction circuit according to a first embodiment of the present invention. A first product code block is applied from the input terminal and an error is detected and corrected by an inner code at an inner code decoding circuit 21. The first product code block signal after error detection and correction is held at a product code block memory circuit 22. After that, an error is detected and corrected by the inner code decoding circuit 21 against the second product code block, and an error flag is set for an uncorrectable signal at the second product code block. In such a manner as to overwrite only a signal lacking an error flag on the product code block memory circuit 22, the error flag is inverted by an inverter 25 and an overwrite permit signal is applied to overwrite the error-free data of the second product code block.

With regard to a product signal block thus prepared, the outer code decoding circuit 24 corrects an error and produces the correction.

Figure 1:
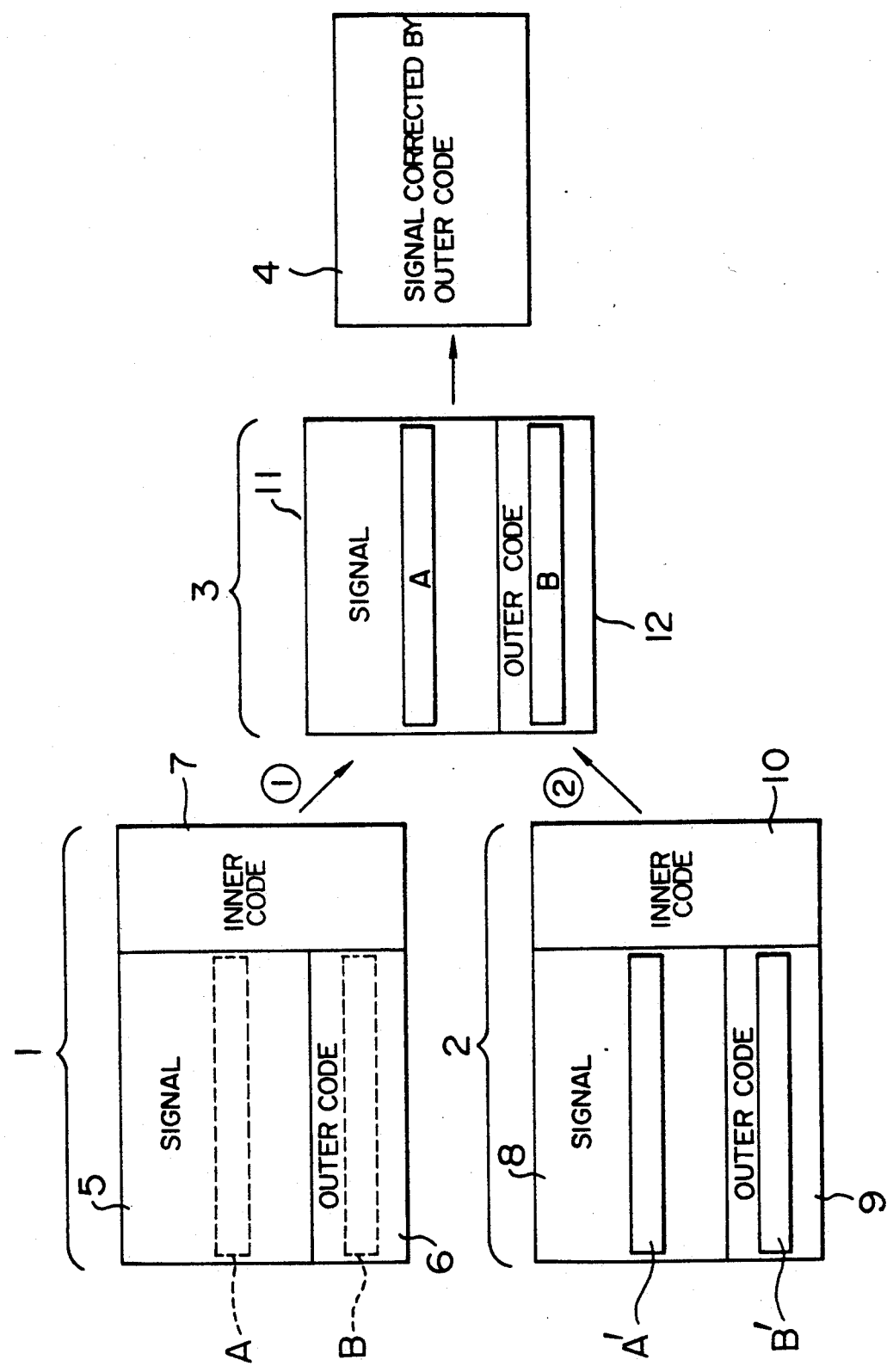
FIG. 1 is a schematic diagram showing the signal processing in an error correction apparatus according to an embodiment of the present invention.

The data change of the code block by this series of signal processings will be explained with reference to FIG. 1. In FIG. 1, numeral 1 designates a first product code block, and numeral 2 a second product code block having the same configuration as in FIG. 2, in which numerals 5, 8 designate signals, numerals 6, 9 outer codes, and numerals 7, 10 inner codes. Numeral 3 designates a product code block produced as an outer from the product code block memory circuit 22 shown in FIG. 3, and numeral 4 an output of the outer code decoding circuit 24. This configuration represents an example of signal blocks A' and B' containing an uncorrectable error. The signal 1 of the first product code block applied to the inner code decoding circuit 21 shown in FIG. 3 has an error detected and corrected for the signal block arranged laterally in FIG. 1, so that the signal 5 and the outer code 6 are stored in the product code block memory circuit 22 (indicated by arrow ① in the drawing). A similar process of decoding of an inner code is effected also for the signal of the second product code block 2.

In the process, the blocks A' and B' are discovered to have an uncorrectable error. The second product code block that has been processed holds the signal 8 and the outer code 9 in the product code block memory circuit 22 except for the blocks A' and B'.

As a result, the new block 3 prepared on the product code block memory circuit 2 is sent to the outer code decoding circuit 24 and after correction by outer code, a signal 4 after correction is produced. According to this configuration, even when the signals of the first and second product code blocks have many errors, a correct signal may be selected from the two blocks to prepare a new block, thus producing a correct output.

Figure 4:
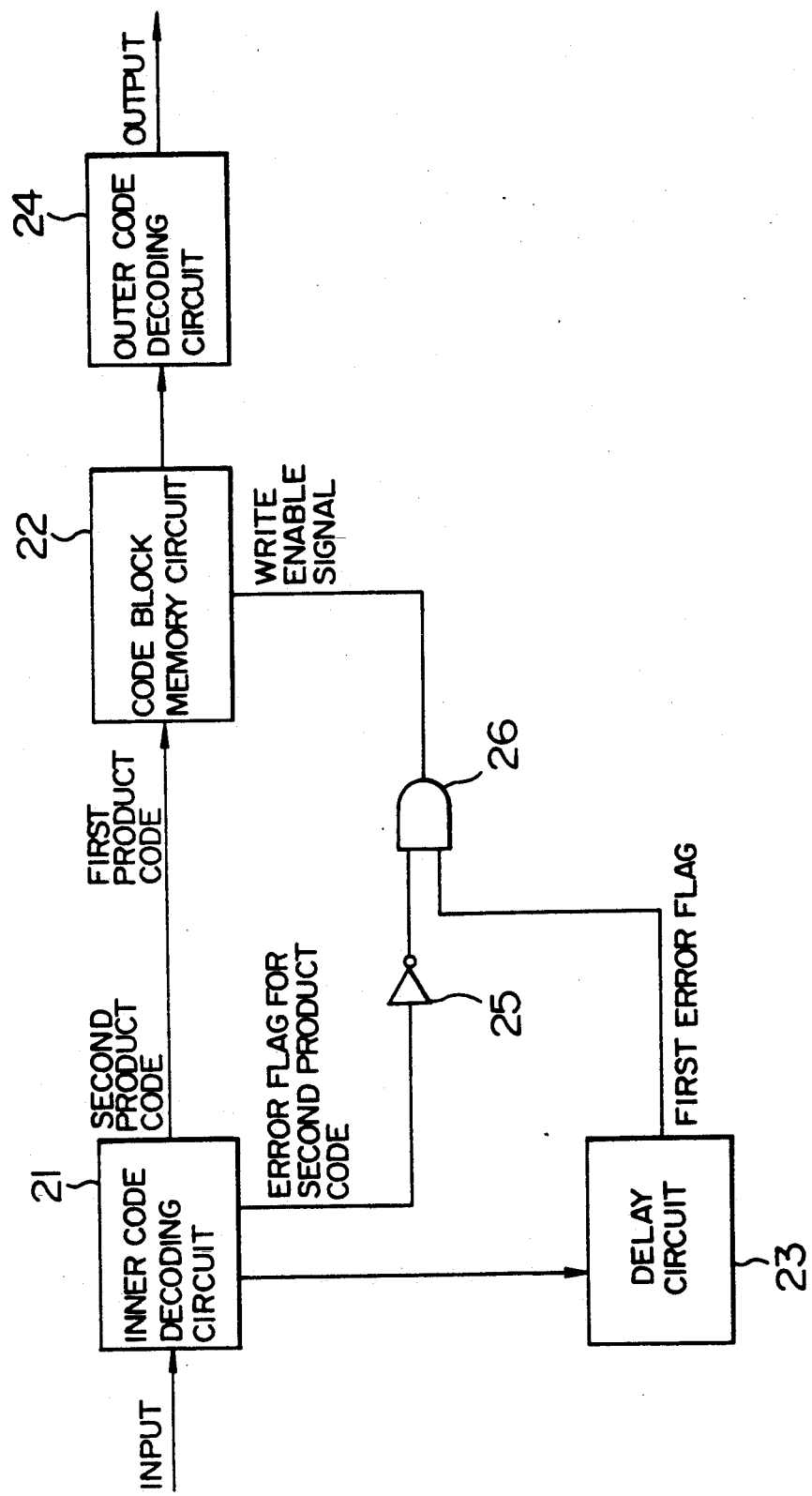

A block diagram of an error correction circuit according to a second embodiment of the present invention is shown in FIG. 4, in which the error flags of both the first and second product code blocks are used. In this circuit, a signal whose error is detected and corrected for the first product code block at an inner code decoding circuit 21 is recorded in a product code block memory circuit corresponding second product code by a delay circuit 23. This delay circuit may be realized by use of a portion of a memory of the product code block memory circuit 22. Specifically, in the case where a word of information is 8 bits, a memory of 9-bit input and output is used for the memory circuit, of which 8 bits are for information storage and the remaining one bit for flag storage. When the information of the first product code block is written, all the information are written together with the flag, while when writing the information of the second product code block, a flag of the address to be written is first read out, followed by overwriting the information of the second product code only when the flag is "1" (the corresponding information of the first product code block has an error). This circuit configuration produces an equivalent effect without providing any delay circuit. As the next step, an error is detected and corrected at the inner code decoding circuit 21 for the second product code block. An overwrite permit signal is produced in such a manner as to write the signal of the second product code block in the product code block memory circuit 22 only in the case where the corresponding first product code signal has an error flag and the signal of the second product code has no error flag. By doing so, the signal of the second product code block is overwritten in the product code block memory circuit 22 only when the signal of the first product code block is uncorrectable and at the same time the signal of the second product code block is not erroneous or erroneous only to such a degree as correctable. The subsequent writing of an erroneous data is therefore eliminated.

Figure 5:
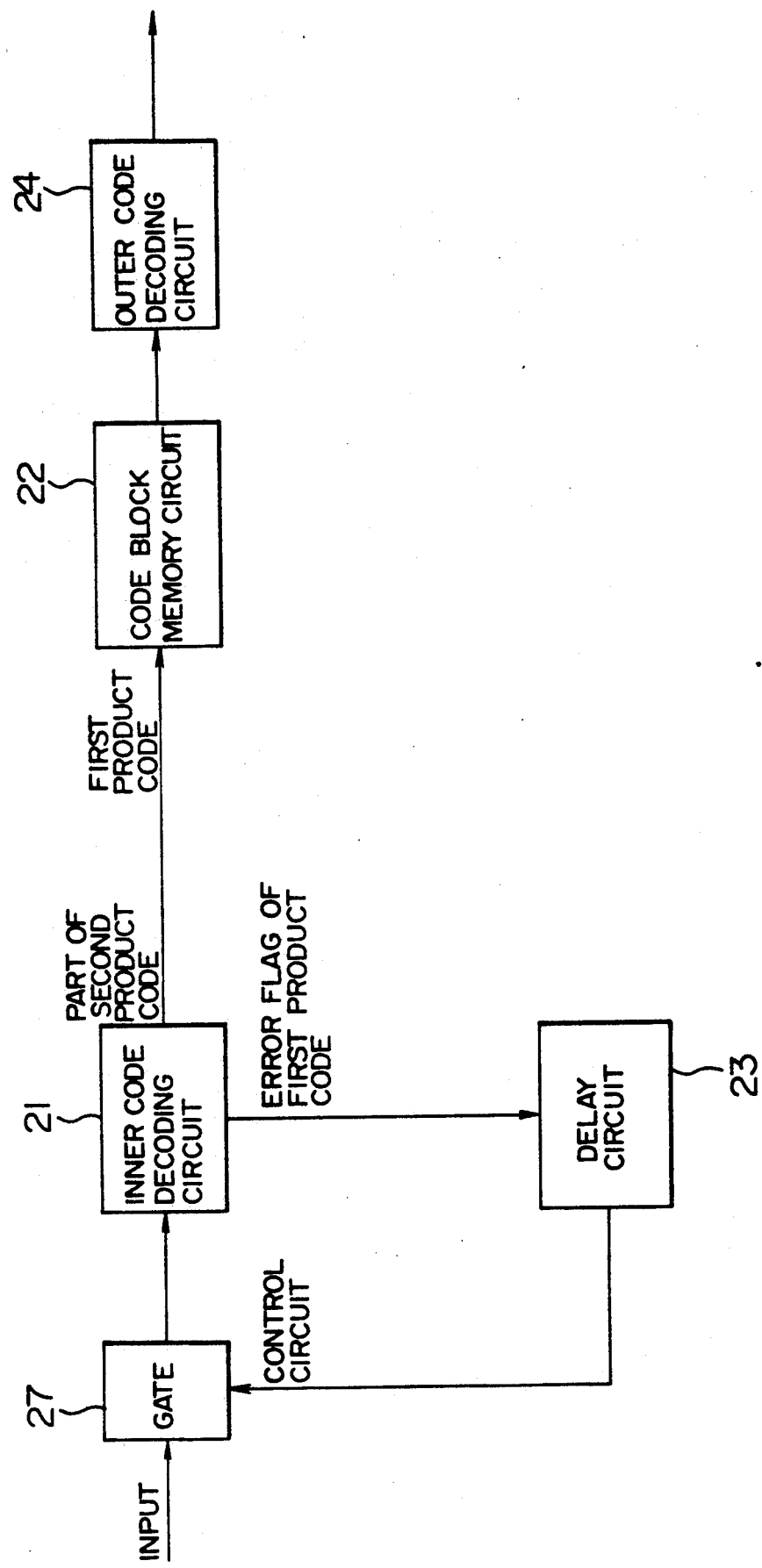

A block diagram of an error correction circuit according to a third embodiment of the present invention is shown in FIG. 5. A gate 27 is inserted before the inner code decoding circuit 21, so that the inner code is decoded only for the portion of the signal of the second product code block which is actually used. All the data of the first product code block have an error detected and corrected at the inner code decoding circuit 21 through the gate 27. In the process, an error flag indicating the uncorrectability is delayed to a corresponding signal of the second product code block by the delay circuit 23. The gate 27 is controlled in such a manner as to pass the second product code block only when the corresponding signal of the first product code block has an uncorrectable error. The signal of the second product code block that has passed the gate 27 has an error detected and corrected at the inner code decoding circuit 21, and overwritten on the corresponding signal of the product code block memory circuit 22. In the process, it is possible to secure the same error-correction effect in this circuit. Also, since the operation time of the inner code decoding circuit 21 is minimized, the power consumption is reduced. The power consumption is further decreased by a CMOS circuit configuration.

Figure 6:
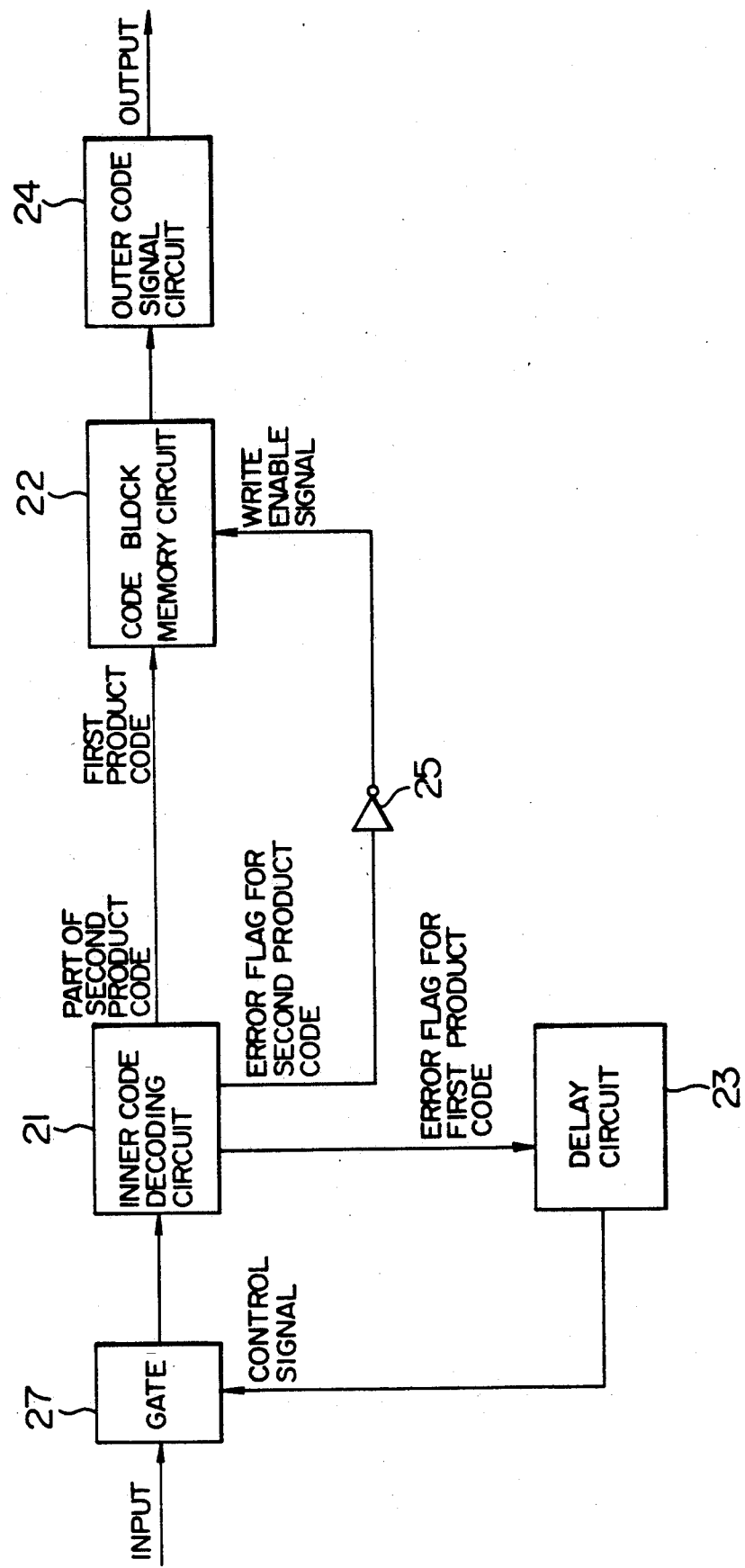

FIG. 6 is a block diagram showing an error correction circuit according to a fourth embodiment of the present invention. In this circuit, a gate 27 is inserted before the inner code decoding circuit 21, so that only the signal of the second product code block in a required amount is decoded with only the correct signal over-written. All the data of the first product code block are passed through the gate 27 and an error is detected and corrected at the inner code decoding circuit 21. In the process, an error flag indicating the uncorrectability is delayed by the delay circuit 23 to the corresponding signal of the second product code block. The gate 27 controls and allows the second product code block to pass only when the corresponding signal of the first product code block has an uncorrectable error. The signal of the second product code block that has passed the gate 27 has an error detected and corrected at the inner code decoding circuit 21, thereby setting an error flag to an uncorrectable signal by the second product code block. In such a manner as to overwrite only this signal free of error flag on the memory circuit 22 of the product code block, the error flag is inverted and applied to the overwrite permit signal. In this circuit, the power consumption is reduced while at the same time preparing a product code block excluding the erroneous data of the second product code block.

Figure 7:
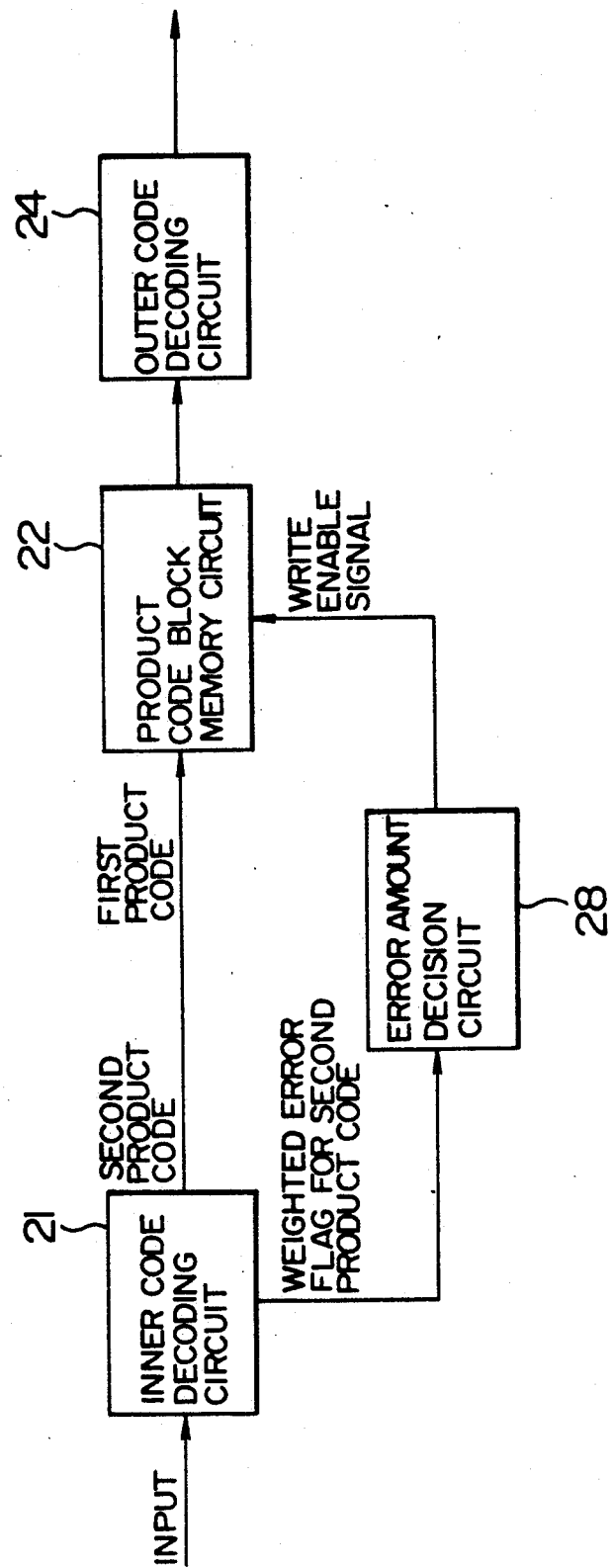

A block diagram of an error correction circuit according to a fifth embodiment of the present invention is shown in FIG. 7. This embodiment is characterized in determining whether the signal of the second product code block is to be overwritten or not according to the degree of error. In this circuit, a signal of which an error is detected is corrected by the inner code decoding circuit 21 for the first product code block and is stored in the product code block memory circuit 22, followed by the error detection and correction at the inner code decoding circuit 21 for the second product code block. In the process, an error flag weighted in accordance with the amount of error contained in the signal is produced for the second product code block. An error flag "0" is produced for the portion completely free of an error in the signal, "1" is outputted when there is one correctable error, and "9" is produced when there is an uncorrectable error. The value of the error flag is determined at an error amount decision circuit 28, so that if the value is less than a predetermined figure, an overwrite permit signal is produced thereby to overwrite the data of the second product code block on the product code block memory circuit 22. This configuration eliminates a signal having many errors, though correctable, thus improving the signal reliability.

Figure 8:
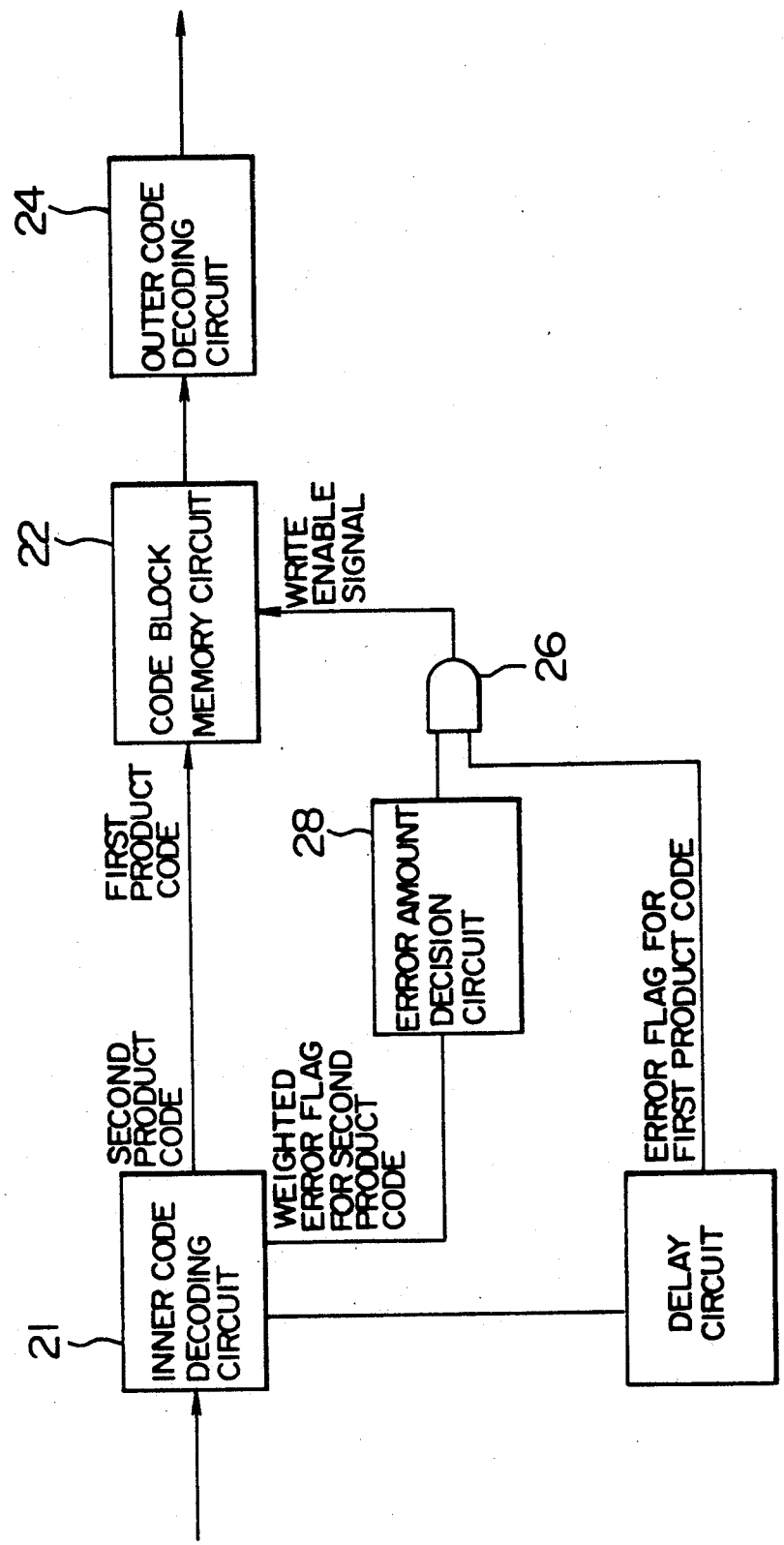

A block diagram of an error correction circuit according a sixth embodiment of the present invention is shown in FIG. 8. This embodiment represents a method of writing the signal of the second product code block where the first product code block is in error, with reference to the error flag of the first product code block and the weighted error flag of the second product code block. First, the signal having an error detected and corrected in the inner code decoding circuit 21 for the first product code block is stored in the product code block memory circuit 22, while storing an error flag indicating the position of an uncorrectable error at the delay circuit 23. As the next step, an error is detected and corrected for the second product code block, and a weighted error flag is produced in accordance with the amount of error as in the case of FIG. 7. Only in the case where the first product code block has an uncorrectable error and at the same time the error in the second product code block is less than a predetermined value, an overwrite permit signal is produced from the circuit 26 so that the signal of the second product code block is overwritten on the product block memory circuit 22. By doing so, even when the second product code block has many errors, a reliable output is produced.

Figure 9:
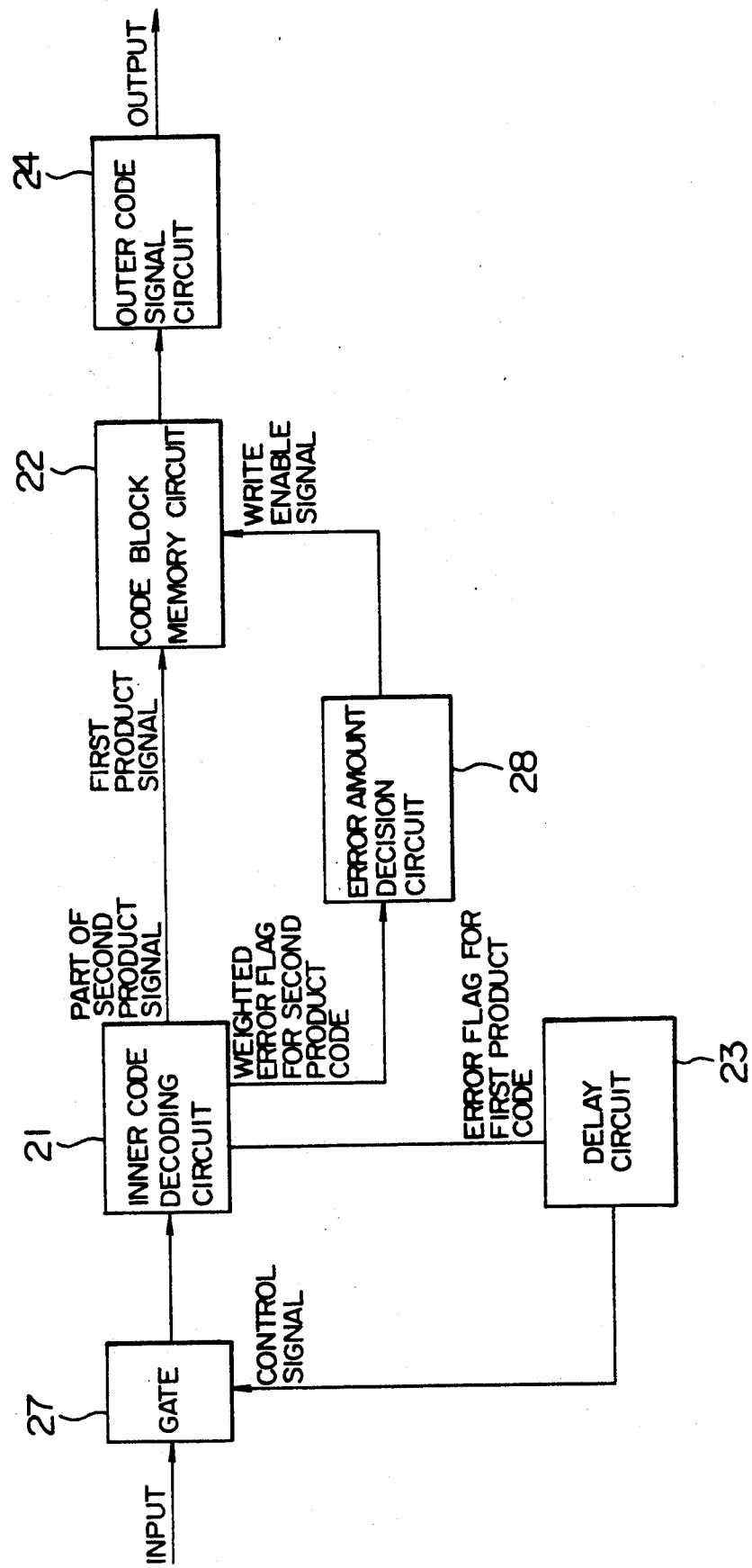

A block diagram of an error correction circuit according to a seventh embodiment of the present invention is shown in FIG. 9. Only in the case where the first product code block has an uncorrectable error, the signal alone corresponding to the second product code block is processed to have an inner code, while the signal is overwritten only if the number of errors in the second product code block is less than a certain value. All the data of the first product code block is sent through the gate 27 to the inner code decoding circuit 21, where the signal has an error detected and corrected and stored in the product code block memory circuit 22. In the process, an error flag indicating an uncorrectable error is stored in the delay circuit 23 at the same time. This signal is used to control the gate 27 in such a manner as to apply the data of the second product code block to the inner code decoding circuit 21 only when the corresponding signal of the first product code block is erroneous. The signal of the second product code block that has passed this process has an error detected and corrected at the inner code decoding circuit 21, after which an error flag weighted as in the case of FIG. 7 is calculated. The amount of this error is determined at the error amount decision circuit 28, and if it is less than a predetermined value, an overwrite permit signal is issued to the product code block memory circuit 22 to overwrite the signal of the second product code block. This configuration makes it possible to reduce the power consumption of the inner code decoding circuit 21 while producing an effect equivalent to that of the circuit shown in FIG. 8.

Figure 10:
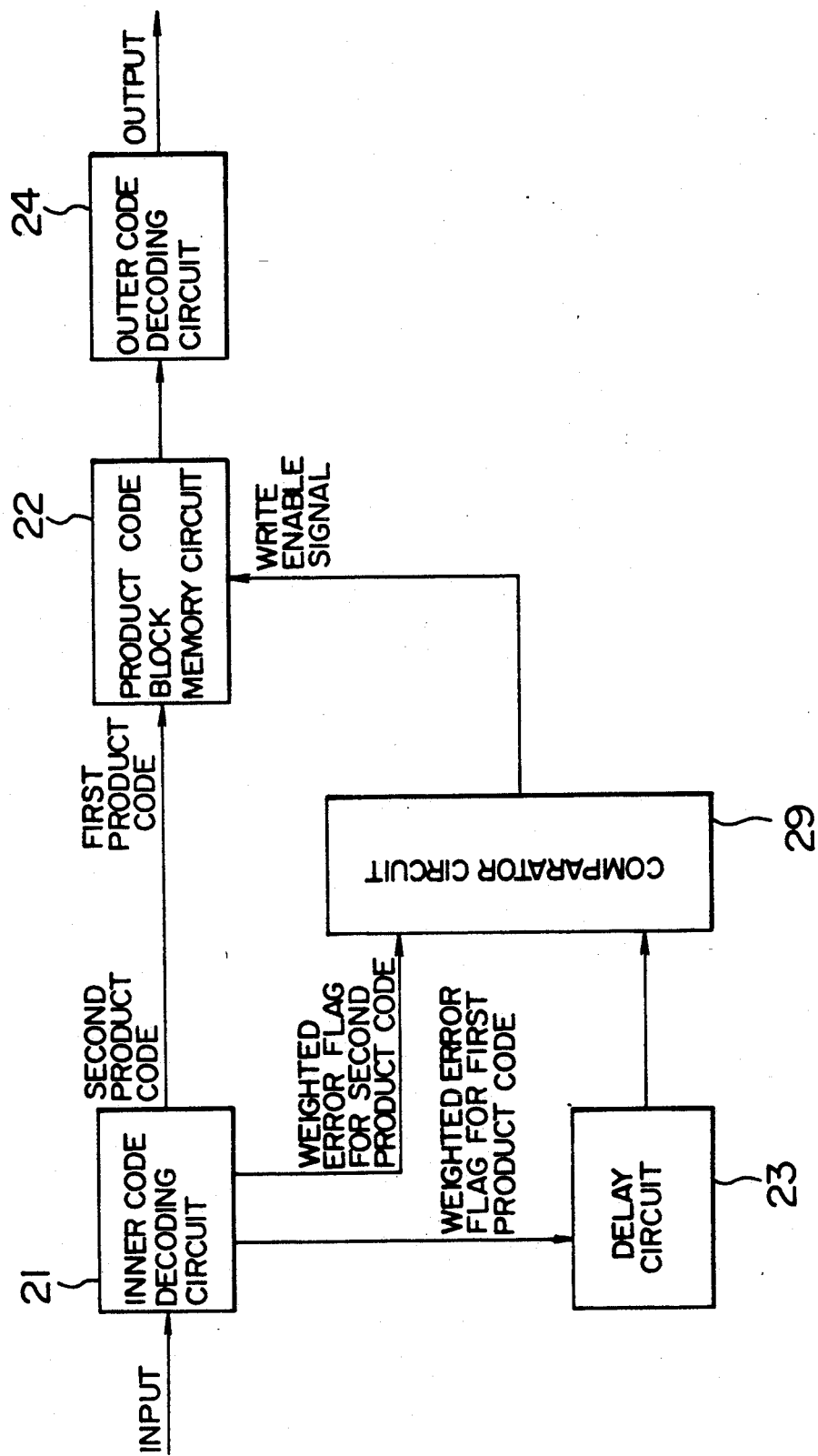

FIG. 10 is a block diagram showing an error correction circuit according to an eighth embodiment of the present invention, in which a weighted error flag is applied also to the first product code block. The first product code block has an error detected and corrected at an inner code decoding circuit 21, and is stored in a product code block memory circuit 22. In the process, as in the case of FIG. 7, a weighted error flag is calculated and is stored in a delay circuit 23. Then, an error is detected and corrected for the second product code block at the inner code decoding circuit 21, so that a weighted error flag is calculated in similar fashion. This second error flag is compared with the first error flag at a comparator circuit 29, and only when the second product code block has fewer errors, an overwrite permit signal is produced with the signal of the second product code block of the particular portion overwritten on the product code block memory circuit 22. In this configuration, reliable data are collected from the first and second product code blocks to prepare a new product code block, for which an outer code is decoded, thereby producing a reliable data. FIGS. 3 to 10 handle a circuit in which the same signal is transmitted or recorded/reproduced twice. A similar technique may be used to produce a reliable output also in the case where the same signal is transmitted or recorded/reproduced thrice or more.

As explained above, according to the embodiment under consideration, even when the same product code is transmitted or recorded/reproduced twice or more with the two blocks containing many errors, correct data are collected to prepare a new block thus making possible error correction. In this way, an error correction apparatus superior to the prior art is realized with a circuit smaller than in conventional apparatuses.

Now, still another embodiment of the invention will be explained.

Figure 11:
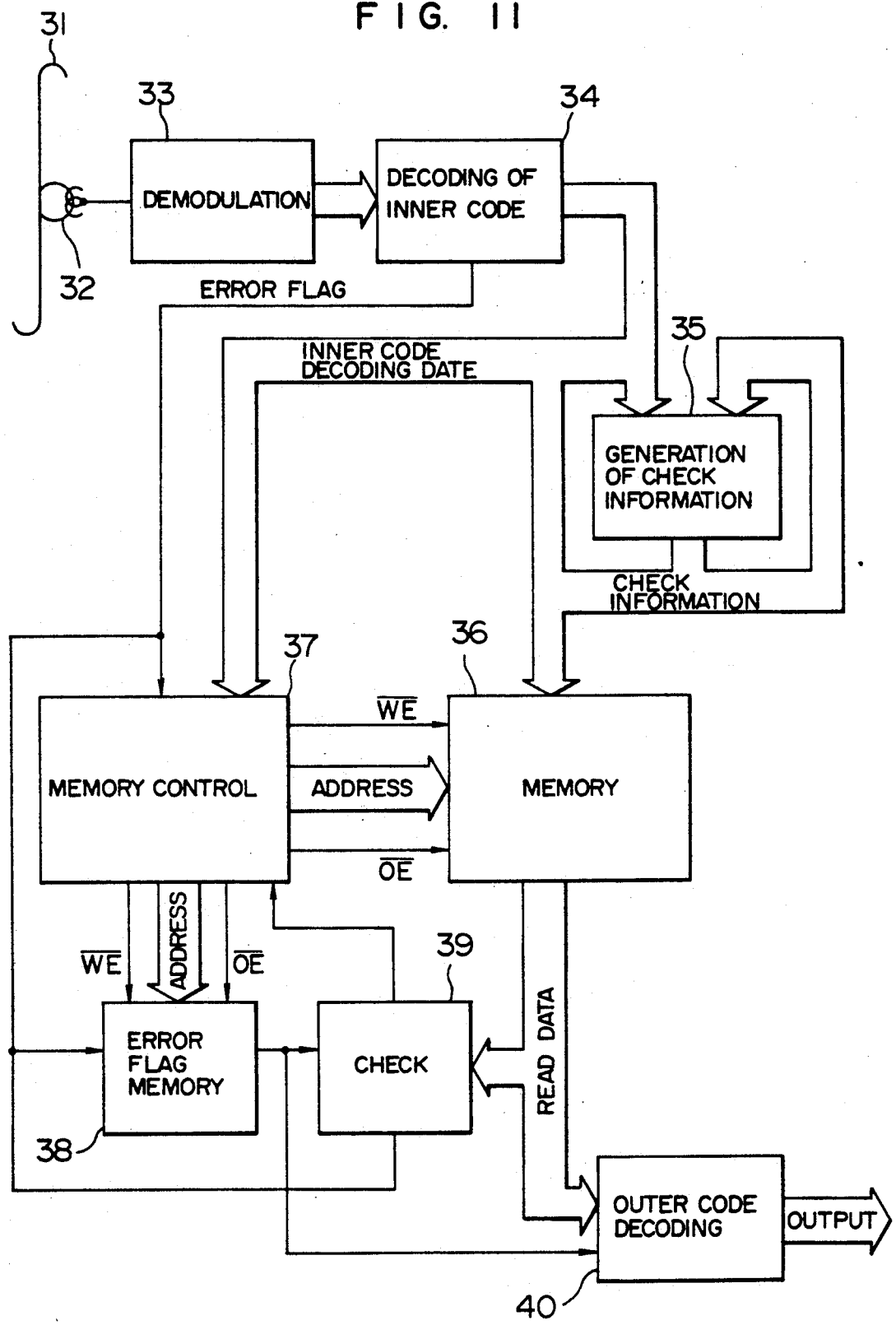
FIGS. 11 and 14 are block diagrams showing ninth and tenth embodiments of the present invention respectively.

FIG. 11 is a block diagram showing a configuration of a code error correction apparatus according to a ninth embodiment of the present invention as applied to the audio signal reproduction system of what is called a D2-format VTR of digital recording type.

In FIG. 11, numeral 31 designates a magnetic tape, numeral 32 a reproducing head mounted on a rotary drum, numeral 33 a demodulation circuit, numeral 34 an inner code decoding circuit, numeral 35 a check information generation circuit for generating check information from a decoded inner code, numeral 36 a memory for storing the data of product code construction, parities and the check information, numeral 37 a memory control circuit for controlling the read and write operation of the memory 36 and an error flag memory 38, numeral 38 the error flag memory for storing an error flag attached to the inner code block by the inner code decoding circuit, numeral 39 a check circuit for comparing and checking the check information, and numeral 40 an outer code decoding circuit.

An audio signal of digital VTR in D2 format is encoded into a product code by the Read-Solomon code having one symbol and eight bits for each channel of a 4-channel audio signal and recorded twice at each end of a helical track. In this way, the double recording of each audio channel strengthens the protection against a code error.

The audio signal converted into a product code by the Read-Solomon code recorded in double form on the magnetic tape 31 has the first product code block thereof reproduced by the magnetic head 32 in the order of inner code blocks and then applied to the demodulation circuit 33 for demodulation in accordance with modulation effected at the time of recording. Further, a sync signal providing a timing reference is detected, and a demodulation signal is applied to the inner code decoding circuit 34 for correcting an error by inner code block. The inner code decoding circuit 34 detects and corrects an error by inner code parity for each inner code block, and applies the decoded data to the check information generation circuit 35, the memory 36 and the memory control circuit 37. In addition, the memory control circuit 37 and the error flag memory 38 are supplied with a signal of "High" level, that is, "1" signal in the case where an uncorrectable error is detected by the inner code decoding, and "Low" signal, that is, "0" signal otherwise. The check information generation circuit 35 generates check information for each inner code block after decoding and applies it to the memory 36.

The check information will be explained by reference to what is called a check sum byte made up of the least significant eight bits of the total sum of data symbols and the parity symbol in each inner code block, for instance. The reproduction signal of D2 format contains an ID signal representing the positional relationship of each inner code block on the recording track corresponding to the position of each inner code block in the product code block. The memory control circuit generates an inner code data, an address in the check information memory 36 and an address in the error flag memory 38, and produces a write pulse $\overline{WE}$, so that the data of each inner code block and the respective information are written in the memory 36 and the error flag memory 38. In the case where the present invention is applied to a system lacking an ID signal, a memory address is preferably generated in accordance with the order of input of the reproduction signal.

In this way, the decoding of the inner code of the first product code block and the writing into the memories 36, 38 are completed. After that, the second product code block recorded in double fashion on the magnetic tape 31 is reproduced in the order of inner codes as in the case of the first product code block. After similar demodulation and decoding of the inner codes, the decoded data are applied to the check information generation circuit 35, the memory 36 and the memory control circuit 37. In similar fashion, the error flag is sent to the memory control circuit 37 and the error flag memory 38. The check information generation circuit 35 similarly generates check information, which is also sent to the memory 36.

The memory control circuit 37 generates the same address in the same manner as in the case of the first product code block, but a different predetermined address for the error flag and the check information thereof. When there is no uncorrectable error with the error flag from the inner code decoding circuit 34 at "Low" level, the write pulse $\overline{WE}$ is produced for all these addresses, so that the inner code data is overwritten on the inner code data at the same position as in the first product code block, while the error flag and the check information are written at a position different from that in the first product code block.

When the error flag is at "High" level, on the other hand, the write pulse $\overline{WE}$ is not produced for the inner code data, but the first inner code data remains in the memory 36. If all the contents of the error flag memory 38 are initialized to "High" level before the first product code reproduction, it is possible to prevent the output of the write pulse $\overline{WE}$ for the error flag or check information in the case where the second decoding of the inner codes is accompanied by an uncorrectable error with the error flag raised to "High" level.

After complete processing of the second inner code block in this way, the memory control circuit 37 supplies the memory 36 and the error flag memory 38 with a read pulse $\overline{OE}$ and an address carrying the check information and the error flag for the first and second processing of the particular inner code block. The memory 36 and the error flag memory 38 apply these signals to the check circuit 39. In spite of the fact that these two error flags are both "Low", the check circuit 39 applies a control command signal to the memory control circuit 37 on the one hand and a "High" error flag to the error flag memory 38 at the same time in the case where the first and second check information fail to coincide with each other. In response to this signal, the memory control circuit 37 applies the address of the error flag for the two decodings of the inner code block together with a write pulse $\overline{WE}$ to the error flag memory 38. This "High" level error flag is written in the two addresses.

Once the reproduction and decoding of all the inner code blocks of the second product code block are complete in this way, the product code block data in the memory 36 make up code blocks as free of error as possible for all the data obtained by two reproductions. Also, the two error flags of each inner code block in the error flag memory 38 are set to "High" level in the case where there is an uncorrectable error in the two decodings or where an error is detected as a result of comparison of check information despite the fact that an uncorrectable error is not detected in the two decodings. As a result, the memory control circuit 37 subsequently applies an outer code data and a parity from the memory 36 to the read outer code decoding circuit 40. At the same time, with regard to each data read from the error flag memory 38, the outer code is decoded with reference to two error flags thereby to improve the correction ability. When two error flags are both "high", the outer code is decoded assuming a data error. The comparative check of the check information may alternatively be conducted collectively during the period between the completion of decoding of all the inner code blocks and the beginning of decoding of outer codes.

If the check information is written in the two check information addresses, first and second, on the memory 36 at the time of the first inner code decoding, the need is eliminated to refer to the error flag when checking for coincidence of the check information. In other words, if an uncorrectable error is detected on the second inner code decoding, neither the error flag nor the check information is written. Further, in the case where an uncorrectable error is detected in the first decoding but not in the second deciding, the check information for the second decoding is written in the check information addresses for both the first and second decodings. Then, two check information fail to coincide with each other only when an uncorrectable error is detected in both the first and second decodings or when no uncorrectable error is detected in the first and second decodings but a false detection or false correction occurs in at least one of the decodings. In such a case, the error flag memory 38 requires no different error flag addresses for the first and second decodings, and neither is it necessary to read the two error flags at the time of outer code decoding thus reducing the number of accesses. Also, the present invention may be applied to a system for multiple recording, in which case the check information is written in all the check information addresses if an uncorrectable error could not be detected in the initial stage of a plurality of decodings.

Figure 12:
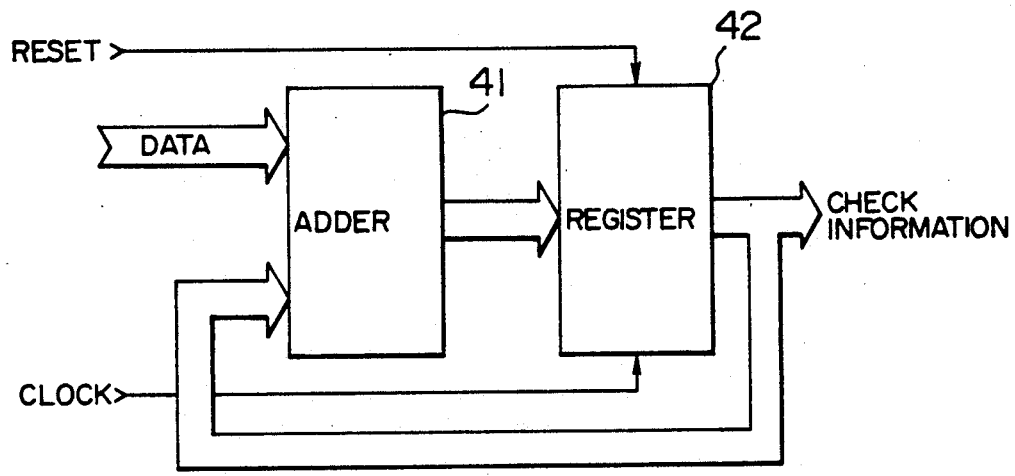
FIG. 12 is a block diagram showing an example of configuration of a check information generation circuit 35.

An embodiment of a check information generation circuit 35 is shown in the block diagram of FIG. 12. In FIG. 12, numeral 41 designates an adder circuit, and numeral 42 a parallel 8-bit register.

Before an inner code block is applied to the check information generation circuit 35, a reset signal is applied to the register 42 to clear all the eight bits. Then, each time of application of the inner code block data to the adder circuit 41, a clock is applied to the register 42. As a result, upon application of the data of A, B, C, .. in that order, the output of the adder circuit 41 changes from (0+A), (A+B), (A+C), . . . , so that the least significant eight bits are latched in the register 42. Upon complete application of an inner code block, the register 42 holds the least significant eight bits of the total sum, which makes up the above-mentioned check information. The check information may of course use other calculations such as multiplication or subtraction.

Figure 13:
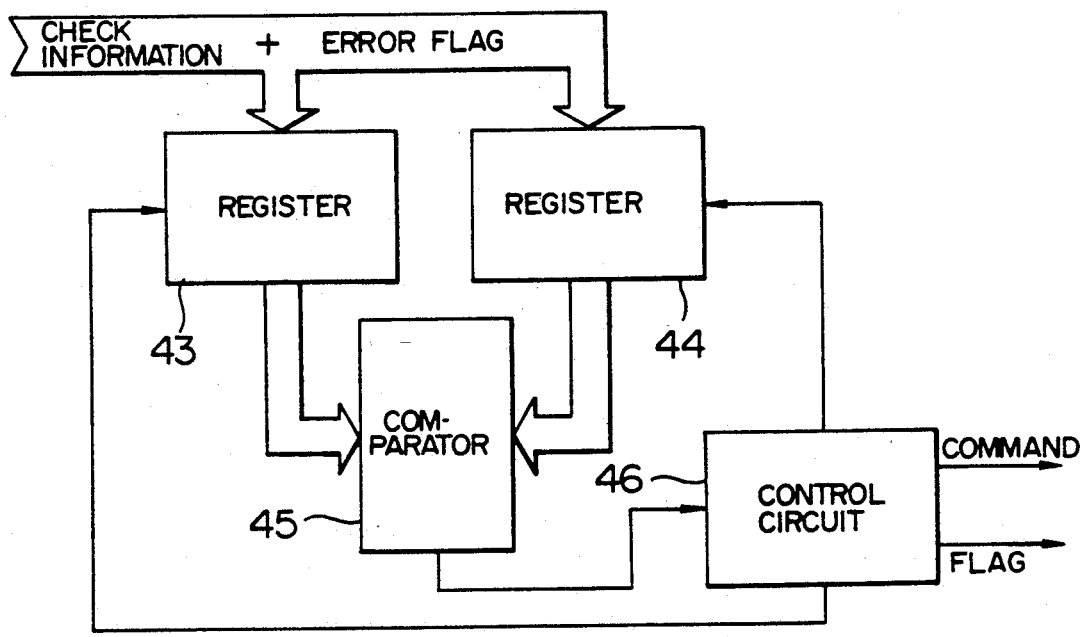

An embodiment of the check circuit 39 is shown by the block diagram of FIGS. 13. In FIG. 13, numerals 43, 44 designate registers, numeral 45 a comparator and numeral 46 a control circuit.

The registers 43, 44 are supplied with the check information of the first inner code block with an error flag, and the check information of the second inner code block with an error flag, respectively, and are latched by a clock from the control circuit 46. The output of the registers 43, 44 is applied to the comparator 45 for comparing only the check information. When the error flag of the output of the registers 43, 44 is both "Low" and the two check information are not coincident with each other, a "High" level signal is applied to the control circuit 46. When the output of the comparator is "High", the control circuit 46 applies a control command signal and a "High" level error flag to the memory control circuit 37 and the error flag memory 38. When the error flag is not referenced, on the other hand, the comparator 45 applies a "Low" signal when the check information is coincident, and a "High" signal when it is not coincident, to the control circuit 46.

Figure 14:
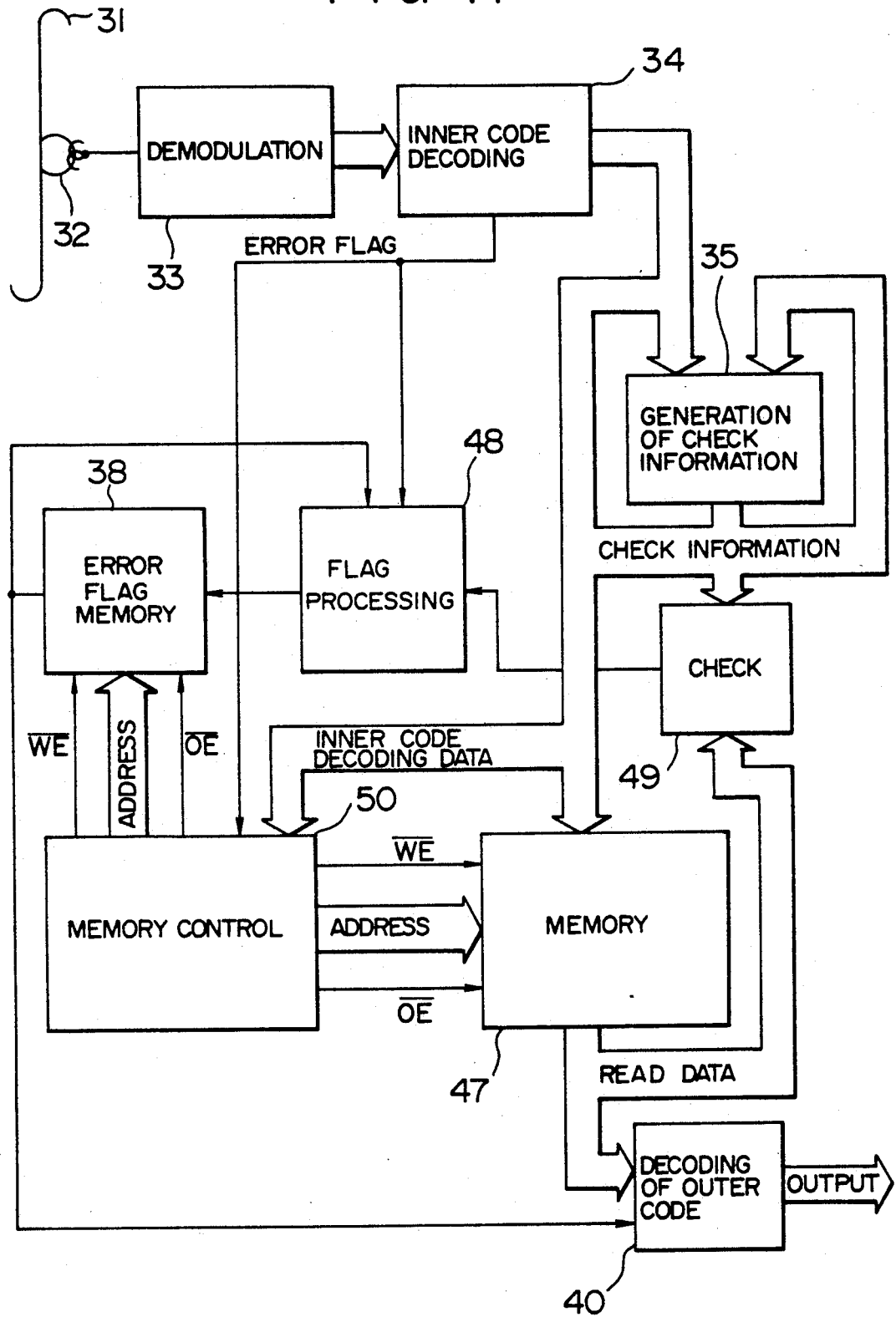

A block diagram of a tenth embodiment of the present invention is shown in FIG. 14. In FIG. 14, numeral 47 designates a memory, numeral 48 a flag processing circuit, numeral 49 a check circuit, and numeral 50 a memory control circuit. According to this embodiment, only one check information address is provided for each inner code block regardless of the number of times of reproduction of the product code block.

As in the ninth embodiment shown in FIG. 11, the data of the first product code block is decoded in the order of inner codes and written in the memory 47 together with the check information. Also, the error flag thereof is written in the error flag memory 38 through the flag processing circuit 48.

Then, in the initial stage of the decoding of the inner codes of the second product code block, a "Low" signal is applied to the memory control circuit 50 as an error flag only when an error is not detected or an error is corrected by the inner code decoding circuit 34 for each inner code block, whereby the memory control circuit 50 applies a write pulse $\overline{WE}$ and the same address as the first inner code data to the memory 47. These inner code data are overwritten on the first inner code data. Then the check information of the first inner code block is read out of the memory 47 and is applied to the check circuit 49. At the same time, the check circuit 49 is supplied with the check information of the second inner code block from the check information generation circuit 35. When these information fail to coincide with each other, a "High" signal is applied to the flag processing circuit 48. When the signal from the check circuit 48 is "High", the flag processing circuit 48 reverses the error flag ("High" level) of the first inner code block read out of the error flag memory by the memory control circuit 50, and applies to again to the error flag memory. This signal is written into the same address as the first error flag by the memory control circuit 50. As a result, when an error is detected in the first decoding and no error is detected in the second decoding, a "High" level signal is reversed to "Low" level and written in the particular address of the error flag memory 38. When the check information fail to coincide in spite of no error in both the first and second decodings, on the other hand, a "Low" level signal is reversed to a "High" level signal and written. In the case where an error is detected in the second decoding, on the other hand, nothing is written holding the first stage. After completion of the entire process of decoding of the inner codes of the second product code block in this way, the error flag due to the inner codes of the memory 47 and the error flag memory 38 and the data of the product code block are equivalent to those in the ninth embodiment shown in FIG. 11, so that the decoding of the outer codes is effected in similar fashion subsequently.

FIG. 15 shows an example of configuration of the check circuit 49 used in the tenth embodiment shown in FIG. 14. In FIG. 15, numerals 51, 53 designate registers, and numeral 52 a comparator. The new check information generated from the second inner code block is applied to the register 51, and the old check information read from the memory 47, to the register 53. The outputs are compared at the comparator 52. The comparator 52 produces a "Low" signal when these outputs are coincident with each other, and a "High" signal otherwise.

An example of configuration of the flag processing circuit 48 is shown in FIG. 16. In FIG. 16, numeral 54 designates a data selector, numeral 55 an exclusive OR gate, and numeral 56 a control circuit. At the time of the first decoding of the inner code, the control circuit 56 switches the data selector 54 to the error flag derived from the inner code decoding circuit 34 and applies it to the error flag memory 38. At the time of the second inner code decoding, on the other hand, the selector 54 is switched to the exclusive OR gate 55, so that when the signal from the check circuit 49 is "High", the error flag read from the flag memory 38 is reversed and produced as an output.

FIG. 18 shows another configuration of the flag processing circuit 48. In FIG. 18, numeral 57 designates a error flag or "High" level generator, numeral 58 a control circuit, numeral 59 an inverter, and numeral 59 a NAND gate.

In this case, when the signal from the NAND gate 60 is "Low", the control circuit 58 switches the data selector 54 to the error flag generator 57, and to the error flag (second error flag) derived from the inner code decoding circuit 34 otherwise. As a result, when the first error flag read out of the error flag memory 38 is "Low" with the check information failing to coincide with each other, a "High" signal is produced from the error flag generator 57.

According to the aforementioned embodiment, a high correction ability is secured by use of a memory having a capacity equivalent to approximately one product code block, while at the same time permitting re-detection of a false detection or correction, thereby improving the reliability of the reproduction of digital information.

We claim:

1. An apparatus for correcting a code error of a product code block defined by outer code blocks each generated by adding an outer code parity to each column of a digital information signal arranged in matrix and inner code blocks each generated by adding an inner code parity to each row of the outer code block, comprising:

inner code decoding means for receiving a product code block and decoding the received product code block in respect of each inner code block by use of a corresponding inner code parity, said inner code decoding means generating an error flag indicating a code block having an uncorrectable error;

memory means for storing the data of the received product code block decoded by the inner code decoding means;

means connected to the inner code decoding means for holding error flags indicating inner code blocks corresponding to data having uncorrectable errors of the data stored in the memory means;

gate means connected to the first stage of the inner code decoding means for passing the first received product code block to the inner code decoding means and selectively passing inner code blocks corresponding to the error flags of the holding means in respect of the second and subsequent product code blocks of the same contents, in which the corresponding data portion in the memory means indicated by the error flags is replaced by the presently decoded data of the inner code block; and outer code decoding means connected to the memory means for decoding the digital information signal stored in the memory means by use of a stored outer code parity after the data is replaced by the inner code decoding means.

2. An apparatus for correcting a code error of a product code block defined by outer code blocks each generated by adding an outer code parity to each column of an digital information signal arranged in matrix and an inner code blocks each generated by adding an inner code parity to each row of the outer code block, comprising:

inner code decoding means for receiving a product code block and decoding the received product code block in respect of each inner code block by use of a corresponding inner code parity, said inner code decoding means generating an error flag indicating a code block having an uncorrectable error;

memory means for storing data of the received product code block decoded by the inner code decoding means;

means connected to the inner code decoding means for holding error flags indicating inner code blocks corresponding to data having uncorrectable errors of the data stored in the memory means;

gate means connected to the inner code decoding means for passing the first received product code block and selectively passing inner code blocks corresponding to the error flags of the holding means with respect to the second and subsequently received product code blocks of the same contents, said inner code decoding means being such that a corresponding portion of the data in the memory means indicated by the error flags is replaced by the data of the inner code block that could be subjected to selected one of decoding and correction in the present data decoding; and outer code decoding means connected to the memory means for decoding the digital information stored in the memory means by use of a stored outer code parity after the data is replaced by the inner code decoding means.

3. A code error correction apparatus according to claim 2, further comprising error amount decision means for determining a weight on the basis of the number of bits of the code error detected and corrected in the decoding of selected one of the second and subsequently received product code blocks by the replacing means and performs the replacing operation when the weight is less than a predetermined value.

4. An apparatus for correcting a code error of a product code block defined by outer code blocks each generated by adding an outer code priority to each column of a digital information signal arranged in matrix and inner code blocks each generated by adding an inner code parity to each row of the outer code block, comprising:

inner code decoding means for receiving the product code block of the same contents at least twice and decoding each received product code block in respect of each inner code block by use of a corresponding inner code parity, said inner code decoding means generating an error flag indicating a block having an uncorrectable code;

memory means for storing the data of the first received product code block decoded by the inner code decoding means;

means connected to the inner code decoding means and the memory means, in which when selected one of the second and subsequently received product code blocks is decoded by the inner code decoding means, error flags for the decoding of the present product code block are used to replace a corresponding portion of the data in the memory means by the data of the inner code block that could be subjected to selected one of decoding and correction in the present data decoding; and outer code decoding means connected to the memory means for decoding the digital information signal stored in the memory means by use of a stored outer code parity after replacing the data by the replacing means.

5. A code error correction apparatus according to claim 4, wherein said replacing means determines a weight in accordance with the number of bits of the code error detected and corrected in the decoding of selected one of the second and subsequently received product code blocks and performs the replacing operation when the weight is less than a predetermined value.

6. A code error correction apparatus according to claim 4, wherein said error flag has the weight information based on the number of bits of the code error detected and corrected in the decoding of a product code block by the inner code decoding means, and said replacing means compares the weight information in the decoding of selected one of the second subsequently received product code blocks with the preceding weight information and performs the replacing operations when the present weight information is smaller than the preceding weight information.

7. An apparatus for correcting a code error of a product code block defined by outer code blocks each generated by adding an outer code parity to each column of the a digital information signal arranged in matrix and inner code blocks generated by adding an inner code parity to each row of the outer code block, comprising:

inner code decoding means for receiving a product code block at least twice and decoding each received product code block in respect of each inner code block by use of a corresponding inner code parity, said inner code decoding means generating an error flag indicating a code block having an uncorrectable error;

memory means for storing the data of the first received product code block decoded by the inner code decoding means;

means connected to the inner code decoding means for holding error flags indicating inner code blocks corresponding to data having uncorrectable errors of the data stored in the memory means;

replacing means connected to the inner code decoding means and the holding means, in which when selected one of the second and subsequently received product code blocks is decoded by the inner code decoding means, error flags in the holding means are used in such a manner that a corresponding portion in the memory means indicated by the error flags is replaced by the data of the inner code block that could be subjected to selected one of decoding and correction in the present data decoding; and outer code decoding means connected to the memory means for decoding the digital information signal stored in the memory means by use of a stored outer code parity after replacing the data by said replacing means.

8. A code error correction apparatus according to claim 7, wherein said replacing means determines a weight on the basis of the number of bits of the code error detected and corrected in the decoding of selected one of the second and subsequently received product code blocks and performs the replacing operation when said weight is less than a predetermined value.

9. A code error correction apparatus according to claim 7, wherein said error flag has the weight information based on the number of bits of the code error detected and corrected in the decoding of a product code block by the inner code decoding means, and said replacing means compares the weight information in the decoding of selected one of the second and subsequently received product code blocks with the preceding weight information and performs the replacing operation when the present weight information is smaller than the preceding weight information.

10. A method of code error correction for a product code block defined by outer code blocks each generated by adding an outer code parity to each column of a digital information signal arranged in matrix and inner code blocks each generated by adding an inner code parity to each row of the outer code block, comprising the steps of:

receiving and decoding said product code block for each inner code block by use of a corresponding inner code parity;

generating an error flag indicating a code block having an uncorrectable error at the time of decoding;

storing the first received product code block data decoded;

receiving and decoding the product code of the same contents in selected one of the second and subsequent decodings;

replacing a corresponding portion in the memory means with the data of an inner code block which could be subjected to selected one of decoding and correction in the present data decoding, on the basis of the error flags at the present time of decoding of the product code block; and decoding the digital information signal stored in the memory means, by use of the stored outer code parity, after data is completely replaced.

11. A method of code error correction for a product code block defined by outer code blocks each generated by adding an outer code parity to each column of a digital information signal arranged in matrix and inner code blocks each generated by adding an inner code parity to each row of the outer code block, comprising the steps of:

receiving and decoding the product code block for each inner code block by use of a corresponding inner code parity;

generating an error flag indicating a code block having an uncorrectable error at the time of decoding;

storing the data of the first received product code block in memory means;

holding error flags indicating inner code blocks corresponding to data having uncorrectable errors of the data stored in the memory means;

receiving selected one of the second and subsequent product code blocks;

replacing the corresponding portion in the memory means indicated by the error flags, with the data of an inner code block that could be subjected to selected one of decoding and correction in the present data decoding, on the basis of the error flags held at the time of decoding selected one of the second and subsequent product code blocks; and decoding the digital information signal stored in the memory means, by use of the stored outer code parity after complete replacement of the data.

12. A method of code error correction according to claim 11, wherein the check information is generated for each inner code block in said step of decoding an inner code; and the replacing operation is not performed when the preceding check information fails to coincide with the present check information in said replacing step.

13. A method of code error correction for a product code block defined by outer code blocks each generated by adding an outer code parity to each column of a digital information signal arranged in matrix and inner code blocks each generated by adding an inner code parity to each row of the outer code block, comprising the steps of:

passing the first received product code block;

decoding the passed product code block for each inner code bock by use of a corresponding inner code parity;

generating an error flag indicating a code block having an uncorrectable error at the time of said decoding;

storing the data of the decoded received product code block in memory means;

holding error flags indicating an inner code block corresponding to data having uncorrectable errors of the data stored in the memory means;

receiving selected one of the second and subsequent product code blocks and selectively passing an inner code block corresponding to the error flags held;

decoding the inner code block selectively passed;

replacing a corresponding portion of the data in the memory means indicated by the error flags, with a data of the presently decoded inner code block; and decoding the digital information signal stored in the memory means by use of the stored outer code parity after complete replacement of the data.

14. A method of code error correction for a product code block defined by outer code blocks each generated by adding an outer code parity to each column of a digital information signal arranged in matrix and inner code blocks each generated by adding an inner code parity to each row of the outer code block, comprising the steps of:

passing the first received product code block;

receiving and decoding the passed product code block for each inner code block by use of a corresponding inner code parity;

generating an error flag indicating a code block having an uncorrectable error at the time of said decoding;

storing the data of the decoded received product code block in memory means;

holding error flags indicating inner code blocks corresponding to data having uncorrectable errors of the data stored in the memory means;

receiving the second and subsequent product code blocks of the same contents and selectively passing inner code blocks corresponding to the error flags in the holding means;

replacing a corresponding portion of the data in the memory means indicated by the error flags, with the data of an inner code block that could be subjected to selected one of decoding and correction at the present time of data decoding; and decoding the digital information signal stored in the memory means, by use of a stored outer code parity after complete replacement of the data.

* * * * *